(12) United States Patent
Hirota et al.

(10) Patent No.: US 7,998,847 B2  
(45) Date of Patent: Aug. 16, 2011

(54) III-NITRIDE CRYSTAL MANUFACTURING METHOD, III-NITRIDE CRYSTAL SUBSTRATE, AND III-NITRIDE SEMICONDUCTOR DEVICE

(75) Inventors: Ryu Hirota, Itami (JP); Koji Uematsu, Itami (JP); Tomohiro Kawase, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/297,311

(22) PCT Filed: Nov. 15, 2007

(86) PCT No.: PCT/JP2007/072191  
§ 371 (c)(1),  
(2), (4) Date: Oct. 16, 2008

(87) PCT Pub. No.: WO2008/087791  
PCT Pub. Date: Jul. 24, 2008

(65) Prior Publication Data  
US 2009/0315150 A1 Dec. 24, 2009

(30) Foreign Application Priority Data

Jan. 16, 2007 (JP) .................................. 2007-006973  
Apr. 24, 2007 (JP) .................................. 2007-114480

(51) Int. Cl.  
*H01L 21/36* (2006.01)

(52) U.S. Cl. ................. 438/493; 438/500; 257/E29.089

(58) Field of Classification Search .................. 438/493, 438/500  
See application file for complete search history.

(56) References Cited

U.S. PATENT DOCUMENTS

| 5,868,837 | A | 2/1999 | DiSalvo et al. |
| 7,732,236 | B2 * | 6/2010 | Nakahata et al. ............. 438/46 |
| 2009/0267190 | A1 * | 10/2009 | Fujiwara et al. ............. 257/615 |

FOREIGN PATENT DOCUMENTS

| JP | H10-312971 A | 11/1998 |
| JP | 2003-183100 A | 7/2003 |
| JP | 2004-221480 A | 8/2004 |
| JP | 2005-225681 A | 8/2005 |

OTHER PUBLICATIONS

Masanori Morishita et al., "The Influences of Supersaturation on LPE Growth of GaN Single Crystals Using the Na Flux Method," Journal of Crystal Growth, Oct. 2004, pp. 402-408, vol. 270, Elsevier, NY.

* cited by examiner

*Primary Examiner* — Alexander G Ghyka  
(74) *Attorney, Agent, or Firm* — James W. Judge

(57) ABSTRACT

Affords methods of manufacturing bulk III-nitride crystals whereby at least the surface dislocation density is low globally.

The present III-nitride crystal manufacturing method includes: a step of preparing an undersubstrate (1) containing a III-nitride seed crystal, the III-nitride seed crystal having a matrix (1s), and inversion domains (1t) in which the polarity in the <0001> directions is inverted with respect to the matrix (1s); and a step of growing a III-nitride crystal (10) onto the matrix (1s) and inversion domains (1t) of the undersubstrate (1) by a liquid-phase technique; and is characterized in that a first region (10s), being where the growth rate of III-nitride crystal (10) growing onto the matrix (1s) is greater, covers second regions (10t), being where the growth rate of III-nitride crystal (10) growing onto the inversion domains (1t) is lesser.

9 Claims, 5 Drawing Sheets

ABSTRACT# III-NITRIDE CRYSTAL MANUFACTURING METHOD, III-NITRIDE CRYSTAL SUBSTRATE, AND III-NITRIDE SEMICONDUCTOR DEVICE

TECHNICAL FIELD

The present invention relates to methods of manufacturing Group-III-nitride crystals of low dislocation density, to III-nitride crystal substrates obtained by the manufacturing methods, and to III-nitride semiconductor devices incorporating the III-nitride crystal substrates.

BACKGROUND ART

III-nitride crystals find applications in light-emitting devices such as light-emitting diodes (LEDs) and laser diodes (LDs), in electronic devices such as rectifiers, bipolar transistors, field-effect transistors, and high-electron-mobility transistors (HEMTs), in semiconductor sensors such as temperature sensors, pressure sensors, radiation sensors, and visible-blind ultraviolet detectors, in surface-acoustic-wave devices (SAW devices), in acceleration sensors, in micro-electromechanical system parts (MEMS parts), in piezoelectric vibrators, in resonators, and in piezoelectric actuators. III-nitride crystal of low dislocation density is being sought after in such applications, in order to improve the performance characteristics of the various devices.

Proposed methods of manufacturing III-nitride crystal to have low dislocation density include the following techniques. Japanese Unexamined Pat. App. Pub. No. 2003-183100 ("Patent Document 1" hereinafter) discloses a facet-growth method in which a mask patterned in regular stripes is provided on an undersubstrate, and atop the mask GaN crystal is vapor-deposited while forming plurally faceted, linear V-grooves and sustaining the grooves, and whereby dislocations within the GaN crystal are gathered directly beneath the V-grooves (the regions into which dislocations concentrate being termed "crystal-defect gathering regions"), reducing the surrounding dislocation density.

With the just-described facet growth method of Patent Document 1, dislocation density in the region apart from the crystal-defect gathering regions can be reduced to a level of $1 \times 10^5$ cm$^{-2}$, yet the dislocation density in the crystal-defect gathering regions will be high. Moreover, in such defect-gathering regions, the polarity in the <0001> directions is often inverted with respect to the crystal region apart from the regions where defects gather. The consequent challenges of epitaxially growing a III-nitride semiconductor layer onto a GaN crystal substrate obtained by facet growth mean low semiconductor device yields.

Meanwhile, Japanese Unexamined Pat. App. Pub. No. H10-312971 ("Patent Document 2" hereinafter) discloses an epitaxial lateral overgrowth (ELO) technique in which an undersubstrate being a GaN thin film formed onto, e.g., sapphire is prepared, from atop the undersubstrate a mask of, e.g., SiO$_2$, having apertures is formed, and GaN crystal is epitaxially grown laterally onto the mask through the apertures.

The just-described ELO technique of Patent Document 2 makes lateral crystal growth without occurrences of strain and cracking possible, thus reducing dislocation density by comparison with implementations in which GaN crystal is grown directly onto an undersubstrate; yet fresh dislocations arise where the laterally growing crystal coalesces, which is prohibitive of getting the dislocation density down to under $1 \times 10^7$ cm$^{-2}$. On this account, making such GaN substrates practicable as substrates for LDs has been problematic.

In another proposal, the detailed description in U.S. Pat. No. 5,868,837 ("Patent Document 3" hereinafter) discloses a sodium flux technique in which, at a temperature of some 600° C. to 800° C. and under a nitrogen atmosphere at a pressure of some 5 MPa, nitrogen gas is supplied to a Ga—Na melt to grow GaN crystal.

The just-described sodium flux method of Patent Document 3 makes it possible to grow low-dislocation-density, low-defect GaN crystal under temperature and pressure conditions relatively moderate for a liquid-phase technique, yet the crystal growth rate is slow, which is prohibitive of obtaining bulk GaN crystal.

In still another proposal, Japanese Unexamined Pat. App. Pub. No. 2004-221480 ("Patent Document 4" hereinafter) discloses forming a starting substrate, in which differing polarity A, B domains coexist, into a skeletal substrate in which the entirety or a portion of either one of the polarity domains has been removed by etching, and by growing onto the skeletal substrate crystal of the same material as the substrate, filling in the given removed portion with crystal having the other polarity, to obtain crystal whose entire surface has the other polarity. With the method of Patent Document 4, however, because the domains of the one polarity are domains in which the polarity in the <0001> directions is inverted with respect to the domains of the other polarity, when those domains are filled in by crystal growth using a vapor-phase technique, growth in which the polarity of those domains (the one polarity) is inherited occurs. Thus, to the extent that the entire crystal surface is to be covered with crystal having the other polarity, the entirety or a portion of the domains of the one polarity in the substrate must be deeply removed by etching, which complicates the manufacturing method.

Patent Document 1: Japanese Unexamined Pat. App. Pub. No. 2003-183100.
Patent Document 2: Japanese Unexamined Pat. App. Pub. No. H10-312971.
Patent Document 3: Detailed Description in U.S. Pat. No. 5,868,837.
Patent Document 4: Japanese Unexamined Pat. App. Pub. No. 2004-221480.

DISCLOSURE OF INVENTION

Problem Invention is to Solve

An object of the present invention is to resolve the problems discussed above by making available methods of manufacturing bulk III-nitride crystal whereby at least the surface dislocation density is low globally, and to make available III-nitride crystal substrates obtained by the manufacturing methods and III-nitride semiconductor devices incorporating the III-nitride crystal substrate.

Means for Resolving the Problems

The present invention is a III-nitride crystal manufacturing method including: a step of preparing an undersubstrate containing a III-nitride seed crystal, the III-nitride seed crystal having a matrix, and inversion domains in which the polarity in the <0001> directions is inverted with respect to the matrix; and a step of growing a III-nitride crystal onto the matrix and inversion domains of the undersubstrate by a liquid-phase technique; characterized in that a first region, being where the growth rate of III-nitride crystal growing onto the matrix is greater, covers second regions, being where the growth rate of III-nitride crystal growing onto the inversion domains is lesser.

In a III-nitride crystal manufacturing method involving the present invention, the undersubstrate may be one in which the surface of the inversion domains is recessed relative to the matrix surface. Furthermore, the inversion domains can be in the form of a plurality of stripe regions along a {0001} plane on the undersubstrate, with the striped regions being arranged parallel to each other at regular intervals. Optionally, the inversion domains can be in the form of a plurality of dot regions along a {0001} plane on the undersubstrate, with the dotted regions being arranged two-dimensionally at regular intervals. Also contemplated is that the inversion domains are in a honeycomb form, arranged two-dimensionally in closed-packed regular hexagons along a {0001} plane on the undersubstrate.

Furthermore, in a III-nitride crystal manufacturing method involving the present invention, the III-nitride crystal may be grown to a thickness of 1 µm or more. Moreover, in its surface the III-nitride crystal can have a resistivity of $1 \times 10^5$ Ω·cm or more. Also, the III-nitride crystal can be grown in a nitride reaction vessel.

In addition, a step of causing the III-nitride crystal that has been grown onto an undersubstrate by a liquid-phase technique to grow further by a vapor-phase technique may also be included a III-nitride crystal manufacturing method involving the present invention.

The present invention is furthermore a III-nitride crystal substrate obtained by processing III-nitride crystal produced by a manufacturing method described above. Herein, the processing of the III-nitride crystal may include a step of slicing or cleaving the III-nitride crystal. The present invention is also a III-nitride semiconductor device in which an at least single-lamina III nitride semiconductor layer is formed onto the just-noted III-nitride crystal substrate.

Effects of the Invention

The present invention affords methods of manufacturing bulk III-nitride crystal whereby at least the surface dislocation density is low globally, affords III-nitride crystal substrates produced by the manufacturing methods, and III-nitride semiconductor devices incorporating the III-nitride crystal substrates.

LEGEND

Figure 1A:
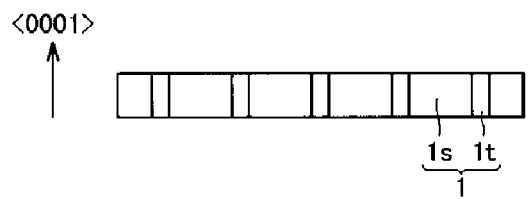
FIG. 1A, in a sectional outline diagram illustrating one embodiment mode of a III-nitride crystal manufacturing method involving the present invention, represents a step of preparing an undersubstrate.

1: undersubstrate
1*f*: squares
1*g*: regular triangles
1*h*: regular hexagons
1*s*: matrix
1*t*: inversion domains $1t_a$, $1t_b$: striped domains
$1t_m$, $1t_n$: dotted domains
2: crystal-growth solution
3: nitrogen-containing gas
7: reaction vessel
10: III-nitride crystal
10s: first region
10t: second regions
10v: vapor-deposited region
100: III-nitride crystal substrate
110, 120: III nitride semiconductor layers
111: n-type $Al_{0.1}Ga_{0.9}N$ cladding layer
112: n-type GaN guide layer
113: multiquantum-well active layer
114: p-type $Al_{0.2}Ga_{0.8}N$ protective layer
115: p-type GaN guide layer
116: p-type $Al_{0.1}Ga_{0.9}N$ cladding layer
117: p-type GaN contact layer
118: p-side electrode
119: n-side electrode
121: undoped $Al_{0.26}Ga_{0.74}N$ spacer layer
122: Si-doped n-type $Al_{0.26}Ga_{0.74}N$ carrier supply layer
123: Si-doped n-type GaN contact layer
125: gate electrode
126: source electrode
127: drain electrode

BEST MODE FOR CARRYING OUT THE INVENTION

Embodiment Mode 1

Figure 1B:
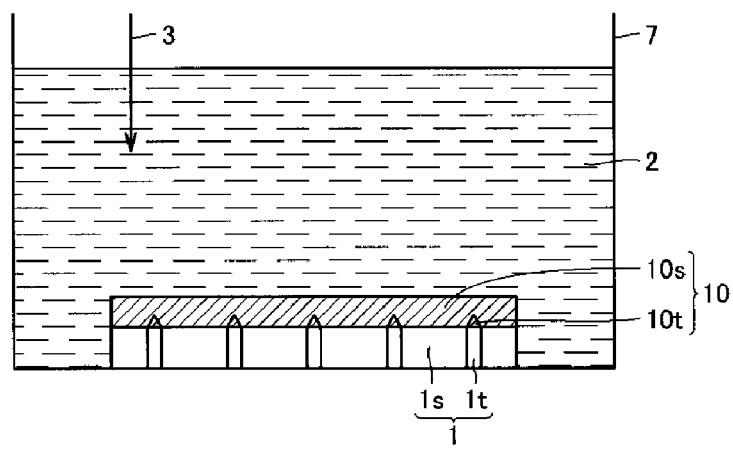
FIG. 1B, in a sectional outline diagram illustrating the one embodiment mode of a III-nitride crystal manufacturing method involving the present invention, represents a step of growing a III-nitride crystal by a liquid-phase technique.

Referring to FIG. 1, one embodiment mode of a III nitride crystal manufacturing method involving the present invention includes: a step (FIG. 1A) of preparing an undersubstrate 1 containing a III nitride seed crystal, the III nitride seed crystal having a matrix 1s and inversion domains 1t in which the polarity in the <0001> directions is inverted with respect to the matrix 1s; and a step (FIG. 1B) of growing a III nitride crystal 10 onto the matrix 1s and inversion domains 1t of the undersubstrate 1 by a liquid-phase technique. Herein, this embodiment mode is characterized in that a first region 10s, in which the growth rate of the III nitride crystal 10 growing onto the matrix is greater, covers second regions 10t in which the growth rate of the III nitride crystal 10 growing onto the inversion domains 1t is lesser.

In Embodiment Mode 1, the III-nitride crystal 10 is grown by a liquid-phase technique onto the undersubstrate 1 containing the III-nitride seed crystal having the matrix 1s and inversion domains 1t in which the polarity in the <0001> directions is inverted with respect to the matrix 1s. Specifically, to begin with the undersubstrate 1 is placed in a reaction vessel 7, and a crystal-growth solution 2 containing a Group-III element is formed surrounding the undersubstrate 1. Next, a nitrogen-containing gas 3 is supplied to the crystal-growth solution 2 to grow the III-nitride crystal 10 onto the undersubstrate 1. Alternatively, a nitrogen-containing substance (for example, a III nitride) may be dissolved into the crystal-growth solution 2 to grow III-nitride crystal onto an undersubstrate.

In the undersubstrate 1, the III-nitride seed crystal is manufactured, for example, as described in paragraphs [0221] through [0271] of Patent Document 1, by a facet growth method by means of hydride vapor phase epitaxy (HVPE), to lower the dislocation density in the matrix 1s of the III-nitride seed crystal, with the dislocation density in the inversion domains 1t of the III-nitride seed crystal being made higher compared with that in the matrix 1s. Herein, FIG. 1 represents the situation in which the undersubstrate 1 is III-nitride crystal formed of the matrix 1s and inversion domains 1t, but a (not-illustrated) undersubstrate in which III-nitride crystal composed of a matrix 1s and inversion domains 1t is formed onto a normative substrate other than III-nitride crystal may also be utilized.

In the III-nitride crystal 10, the first region 10s, growing onto the matrix 1s of the undersubstrate 1, grows as crystal inheriting the polarity of, and low dislocation density in, the matrix 1s. Meanwhile in the III-nitride crystal 10, the second regions 10t, growing onto the inversion domains 1t of the undersubstrate 1, grow as crystal inheriting the polarity of, and high dislocation density in, the inversion domains 1t. Accordingly, in the second regions 10t in the III-nitride crystal 10, the polarity in the <0001> directions is inverted with respect to the first region 10s, and the dislocation density is raised.

The crystal-growth rate in the first region 10s, however, is greater than that in the second regions 10t. Therefore, along with the growth of the III-nitride crystal 10, the first region 10s covers over and buries the second regions 10t. Growing the III-nitride crystal 10 in this manner leads to crystal in which, with the crystal being grown beyond a certain thickness, the first region 10s exists alone, making it possible to manufacture III-nitride crystal at least the surface of which has a single polarity, with dislocation density being low across the surface globally. That is, in this embodiment mode, giving attention to the fact that the crystal-growth rate in the first region 10s is greater than that in the second regions 10t enables manufacturing III-nitride crystal at least the surface of which has a single polarity with dislocation-density being low across the surface globally, without, in an undersubstrate as set forth in Patent Document 4, deep-etching removal of the entirety or a portion of the domains of one polarity.

As just described, the inventors of the present invention discovered a new phenomenon in which, in III-nitride crystal growth by a liquid-phase technique, a great difference arises between the growth rate at which crystal grows onto inversion domains in seed crystal, and the growth rate at which crystal grows onto the matrix therein. One feature of the present invention is to exploit this discovery to afford technology whereby crystal of, at least in the surface, single polarity globally and low dislocation density globally is manufactured by preparing seed crystal having inversion domains where defect density is regionally high, and burying the inversion domains.

Herein, in the III-nitride crystal growth, the crystal thickness at which the second regions 10t become covered with the first region 10s (also referred to as the "second region-covering crystal thickness," likewise hereinafter) is determined by the area of the surface of the inversion domains 1t, and on the crystal-growth conditions for the III-nitride crystal 10.

In Embodiment Mode 1, while the liquid-phase technique for growing III-nitride crystal 10 onto an undersubstrate 1 is not particularly limited, inasmuch as creating the high-temperature, high-pressure conditions whereby III-nitride crystal becomes molten is problematic with facilities for manufacturing practical 2-inch diameter crystal, solution deposition is preferably utilized. Furthermore, from a job-safety perspective, it is particularly preferable to utilize chiefly a Group III element-containing melt for the solution.

In Embodiment Mode 1, the layout of the matrix 1s and inversion domains 1t in the III-nitride seed crystal contained in the undersubstrate 1 is not particularly limited, but from the perspective of allowing the first region 10s to efficiently cover the second regions 10t in the growth of III-nitride crystal 10, it is preferable to have the layout be as the following embodiment modes.

Embodiment Mode 1A

Figure 3:
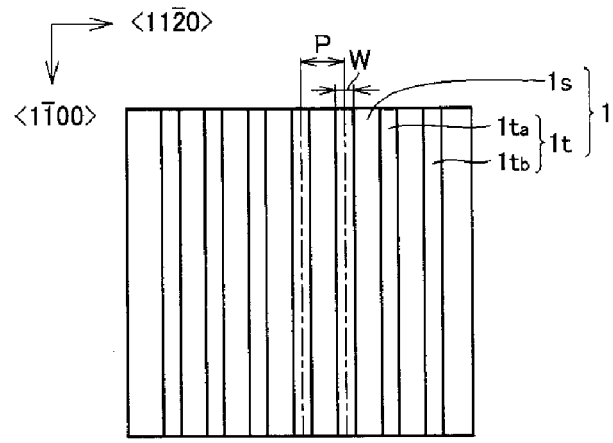
FIG. 3 is an outline plan view representing one example of an inversion domain layout in an undersubstrate utilized in a III-nitride crystal manufacturing method involving the present invention.
Figure 4:
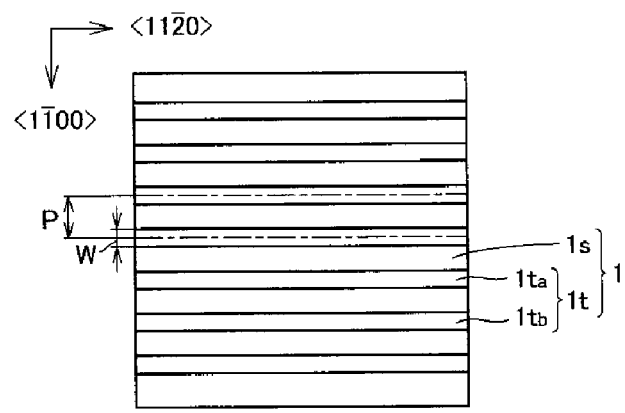
FIG. 4 is an outline plan view representing another example of an inversion domain layout in an undersubstrate utilized in a III-nitride crystal manufacturing method involving the present invention.
Figure 5:
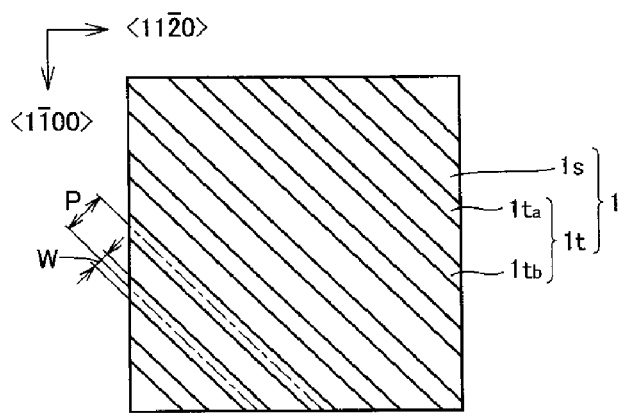
FIG. 5 is an outline plan view representing a further example of an inversion domain layout in an undersubstrate utilized in a III-nitride crystal manufacturing method involving the present invention.

Referring to FIGS. 3 through 5, in one embodiment mode of the layout of the inversion domains 1t in the undersubstrate 1, the inversion domains 1t are in the form of a plurality of stripe domains $1t_a$ and $1t_b$ along a {0001} plane on the undersubstrate 1, with the striped domains $1t_a$ and $1t_b$ each being arranged parallel to each other at regular intervals. From the perspective of carrying out uniform crystal growth, preferable is that the striped domains $1t_a$ and $1t_b$ each have the predetermined width of W, and are arranged parallel to each other with the predetermined pitch of P. Furthermore, a stripe orientation of each of the striped domains $1t_a$ and $1t_b$ is not particularly limited, but from the perspective of stably growing inversion domains, the stripe orientation preferably parallels the <1-100> or <11-20> directions. That is because the fact that in liquid deposition, growth rate is slower compared with that in HVPE and other high-productivity vapor-phase techniques causes crystal habits reflecting crystallographic structure to tend to appear, meaning that (not-illustrated) hexagonal columnar or hexagonal trapezoidal terraces are liable to form on the surface on whish crystal is grown, and crystal growth of the lateral sides of the terraces mainly in the orientation perpendicular to the <0001> directions, as well as in the orientation perpendicular to the <1-100> directions causes the first region 10s to coalesce at the sides paralleling each other, which prompts the growth of the first region 10s, in the growth of the III-nitride crystal 10.

An example of the stripe orientation, paralleling the <1-100> directions, of each of striped domains is represented in FIG. 3, an example of the stripe orientation paralleling the <11-20> directions is represented in FIG. 4, and an example of the stripe orientation paralleling the direction rotated 45° in the <11-20> directions with respect to the <1-100> directions is represented in FIG. 5.

Embodiment Mode 1B

Figure 6:
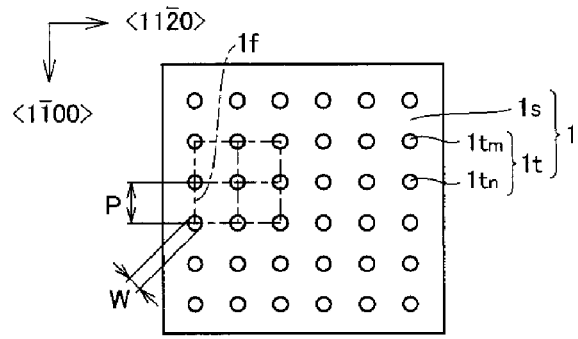
FIG. 6 is an outline plan view representing still another example of an inversion domain layout in an undersubstrate utilized in a III-nitride crystal manufacturing method involving the present invention.
Figure 7:
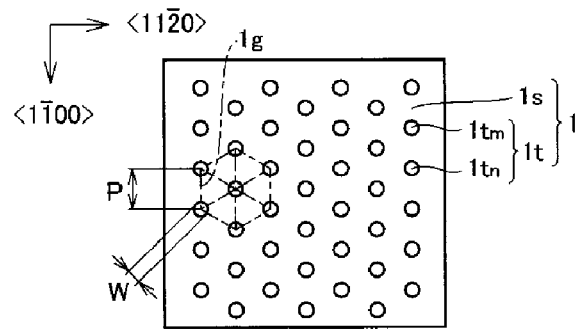
FIG. 7 is an outline plan view representing a still further example of an inversion domain layout in an undersubstrate utilized in a III-nitride crystal manufacturing method involving the present invention.

Referring to FIGS. 6 and 7, in still another embodiment mode of the layout of the inversion domains 1t in the undersubstrate 1, the inversion domains 1t are in the form of a plurality of dot domains $1t_m$ and $1t_n$ along a {0001} plane on undersubstrate, with the dotted domains $1t_m$ and $1t_n$ each being arranged two-dimensionally at regular intervals. Arranging the inversion domains 1t as the dotted domains $1t_m$ and $1t_n$ enables enlarging the area of the surface of the matrix 1s, compared with arranging the inversion domains 1t as striped domains (Embodiment Mode 1A), meaning that the area of the surface of a first region 10s (low-dislocation-density region) in III-nitride crystal to be grown increases, so that second regions (high-dislocation-density regions) can be covered even if the III-nitride crystal thickness is smaller.

Herein, the two-dimensional, regular layout is not particularly limited. In FIG. 6, the dotted domains $1t_m$ and $1t_n$ with a diameter of W are arranged so that their centers are positioned respectively at the vertices of close-packed squares 1f, arranged two-dimensionally, having a side of P. Herein, the orientation of either pair of facing sides of the squares 1f parallels the <1-100> directions. In other words, the dotted domains $1t_m$ and $1t_n$ whose diameter is W are each arranged paralleling the <1-100> and <11-20> directions with a constant pitch of P.

Moreover, as illustrated in FIG. 7, from the perspective of readily concentrating dislocations into inversion domains, the dotted domains $1t_m$ and $1t_n$ with a diameter of W are preferably arranged so that their centers are positioned respectively at the vertices of close-packed regular triangles 1g, arranged two-dimensionally, having a side of P. Herein, the orientation of any one side of each of the above regular triangles 1g preferably in particular parallels the <1-100> directions. That is because in liquid deposition, (not-illustrated) hexagonal columnar or hexagonal trapezoidal terraces tend to form on the surface on which crystal is grown, and the fact that the lateral sides of the terraces grow mainly in the orientation perpendicular to the <0001> directions, as well as in the orientation perpendicular to the <1-100> directions causes the first region 10s to coalesce at the sides paralleling each other, which prompts the growth of the first region 10s, in the growth of the III-nitride crystal 10.

Embodiment Mode 1C

Figure 8:
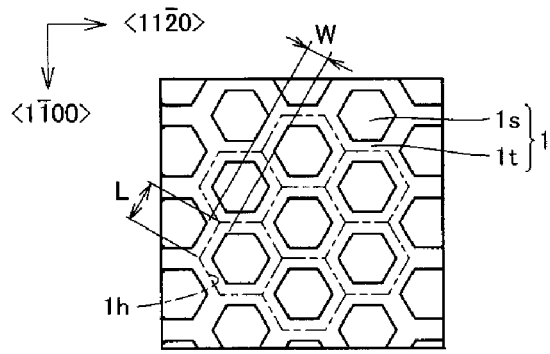
FIG. 8 is an outline plan view representing yet another example of an inversion domain layout in an undersubstrate utilized in a III-nitride crystal manufacturing method involving the present invention.
Figure 9:
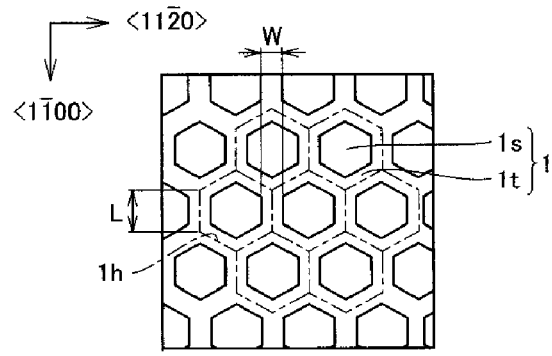
FIG. 9 is an outline plan view representing an even further example of an inversion domain layout in an undersubstrate utilized in a III-nitride crystal manufacturing method involving the present invention.
Figure 10A:
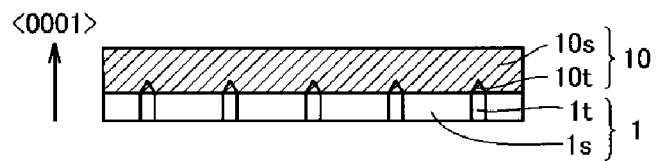
FIG. 10A, in a sectional outline diagram illustrating a further embodiment mode of a III-nitride crystal manufacturing method involving the present invention, represents III-nitride crystal grown onto an undersubstrate by a liquid-phase technique.
Figure 10B:
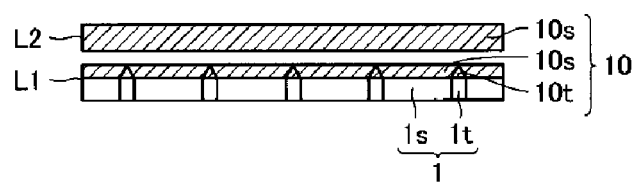
FIG. 10B, in a sectional outline diagram illustrating this further embodiment mode of a III-nitride crystal manufacturing method involving the present invention, represents a step of forming III-nitride crystal substrates.

Referring to FIGS. 8 and 9, in a further embodiment mode of the layout of the inversion domains 1t in the undersubstrate, the inversion domains 1t are in a honeycomb form, arranged in close-packed regular hexagons 1h two-dimensionally along a {0001} plane on the undersubstrate 1, having sides L. Herein, "honeycomb" means the region having width W, centered on the six sides of the regular hexagons 1h, as illustrated in FIGS. 8 and 9.

Herein, the orientation of the above six sides is not particularly limited, but from the perspective of stably growing inversion domains, preferably parallels the <1-100> or <11-20> directions. III-nitride crystal having a wurtzite crystallographic structure, the orientation of the above six sides illustrated in FIG. 8 parallels the <11-20> directions, and the orientation of the above six sides illustrated in FIG. 9 parallels the <1-100> directions, since the crystallographic structure is of six-fold symmetry in a {0001} plane. Moreover, it is particularly preferable that the orientation of the six sides parallels the <1-100> directions. This is because in liquid deposition, (not-illustrated) hexagonal columnar or hexagonal trapezoidal terraces readily form on the crystal-growth surface, and since the lateral sides of the terraces grow in directions perpendicular to the <0001> directions, as well as in directions perpendicular to the <1-100> directions, first regions 10s in the growth of the III-nitride crystal 10 unite along surfaces paralleling each other, thanks to which growth of the first region 10s is promoted.

Furthermore, in Embodiment Mode 1, III-nitride crystal is preferably grown to a thickness of 1 μm or more. Because growing a III nitride crystal 10 having a thickness of 1 μm or more onto the matrix 1s and inversion domains 1t of the undersubstrate 1 by a liquid-phase technique ensures that the first region 10s covers the second regions 10t, III-nitride crystal at least the surface of which has a single polarity, with dislocation density being low across the surface globally can be readily manufactured.

Moreover, in III-nitride crystal, the surface preferably has a resistivity of $1 \times 10^5$ Ω·cm or more, from the perspective of forming high-resistivity substrates employed in, for example, HEMTs. Herein, the III-nitride crystal whose surface has a resistivity of $1 \times 10^5$ Ω·cm or more can be readily manufactured by the above manufacturing method.

Also, in Embodiment Mode 1, a reaction vessel for growing III-nitride crystal is not particularly limited as long as it is chemically stable with sufficient heat-resistance, and is high in mechanical strength, and the reaction vessel is preferably formed of oxides such as aluminum oxide ($Al_2O_3$), or of nitrides such as pyrolytic boron nitride (pBN). From the perspective of preventing impurities from being mixed into crystal, and of enabling manufacturing more readily low-dislocation-density, high-resistivity crystal, the reaction vessel is more preferably formed of nitrides such as pBN.

Embodiment Mode 2

Figure 2A:
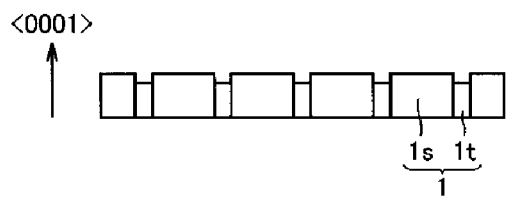
FIG. 2A, in a sectional outline diagram illustrating another embodiment mode of a III-nitride crystal manufacturing method involving the present invention, represents a step of preparing an undersubstrate.
Figure 2B:
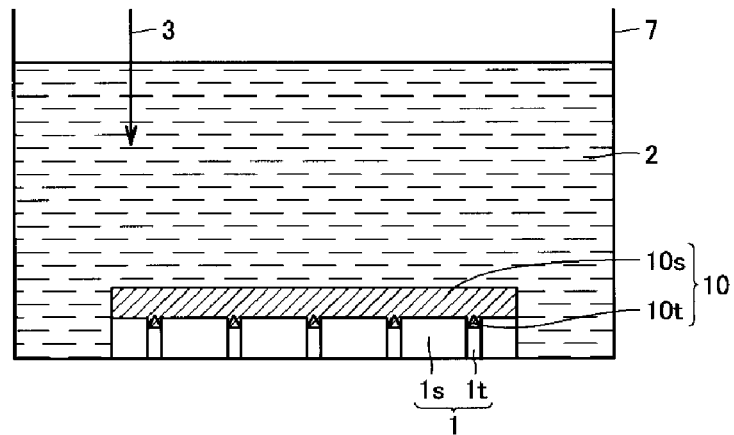
FIG. 2B, in a sectional outline diagram illustrating this other embodiment mode of the III-nitride crystal manufacturing method involving the present invention, represents a step of growing a III-nitride crystal by a liquid-phase technique.

Referring to FIG. 2, another embodiment mode of a III-nitride crystal manufacturing method involving the present invention includes: a step (FIG. 2A) of preparing an undersubstrate 1 containing a III-nitride seed crystal, the III-nitride seed crystal having a matrix 1s and inversion domains 1t in which the polarity in the <0001> directions is inverted with respect to the matrix 1s; and a step (FIG. 2B) of growing a III-nitride crystal 10 onto the matrix 1s and inversion domains 1t of the undersubstrate 1 by a liquid-phase technique. Herein, this embodiment mode is characterized in that a first region 10s, being where the growth rate of the III-nitride crystal 10 growing onto the matrix is greater, covers second regions 10t, being where the growth rate of the III-nitride crystal 10 growing onto the inversion domains 1t is lesser. Also, the embodiment mode is characterized in that in the undersubstrate 1, the surface of the inversion domains 1t is recessed relative to the surface of the matrix 1s.

That is, in this embodiment mode, referring to FIG. 2, in the undersubstrate 1 for growing the III-nitride crystal 10 in Embodiment Mode 1, the surface of the inversion domains 1t is recessed relative to the surface of the matrix 1s. More precisely, the undersubstrate 1 has the surface with recesses and terraces, and the surface of the inversion domains 1t forms the recesses, while the surface of the matrix 1s forms the terraces.

In this embodiment mode, the fact that the surface of the inversion domains 1t of, is recessed relative to the surface of the matrix 1s of, the undersubstrate 1 gives higher priority to the growth of the first region 10s growing onto the matrix 1s over the growth of the second regions 10t growing onto the inversion domains 1t in growing the III-nitride crystal 10 onto the surface of the undersubstrate 1, compared with the case in Embodiment Mode 1 to reduce second region-covering crystal thickness. Therefore, growth of thinner crystal—that is, crystal growth for shorter period of time—makes it possible to manufacture III-nitride crystal at least the surface of which has a single polarity, and the dislocation density is low globally.

Also in Embodiment Mode 2, as in Embodiment Mode 1, preferable is that: the layout of the inversion domains 1t in undersubstrate is the same layout as any of Embodiment Modes 1A, 1B, and 1C; III-nitride crystal is grown to a thickness of 1 μm or more; in the III-nitride crystal, the surface has a resistivity of $1 \times 10^5$ Ω·cm or more; a reaction vessel for growing the III-nitride crystal is formed of oxides such as $Al_2O_3$ or nitrides such as pBN, with nitrides such as pBN being more preferable.

Embodiment Mode 3

Figure 11A:
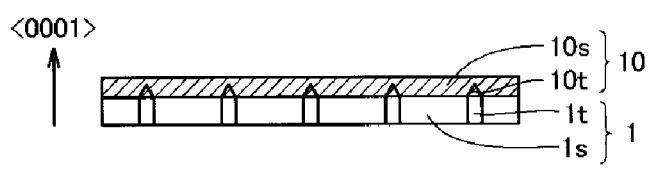
FIG. 11A, in a sectional outline diagram illustrating yet another embodiment mode of a III-nitride crystal manufacturing method involving the present invention, represents III-nitride crystal grown onto an undersubstrate by a liquid-phase technique.
Figure 11B:
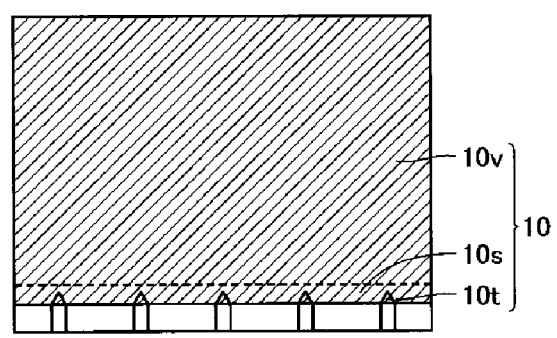
FIG. 11B, in a sectional outline diagram illustrating this yet other embodiment mode of a III-nitride crystal manufacturing method involving the present invention, represents a step of causing the III-nitride crystal that has been grown by a liquid-phase technique to grow further by a vapor-phase technique.

Referring to FIGS. 1, 2, and 11, a further embodiment mode of a III-nitride crystal manufacturing method involving the present invention includes: a step (FIGS. 1A and 2A) of preparing an undersubstrate 1 containing a III-nitride seed crystal, the III-nitride seed crystal having a matrix 1s and inversion domains 1t in which the polarity in the <0001> directions is inverted with respect to the matrix 1s; a step (FIGS. 1B and 2B) of growing a III-nitride crystal 10 onto the matrix 1s and inversion domains 1t of the undersubstrate 1 by a liquid-phase technique; and a step (FIGS. 11A and 11B) of further growing by a vapor-phase technique the III-nitride crystal 10 grown onto the undersubstrate 1 by the liquid-phase technique.

That is, Embodiment Mode 3 includes the step (FIGS. 11A and 11B) of further growing by a vapor-phase technique the III-nitride crystal 10 that has been grown onto the undersubstrate 1 by a liquid-phase technique in Embodiment Mode 1 or 2. Such a step enables manufacturing efficiently, at a high growth rate and at low cost, III-nitride crystal at least whose surface has—with dislocation density being low globally—a single polarity. Herein, as illustrated in FIG. 11B, in the III-nitride crystal 10, a first region 10s and second regions 10t grown by a liquid-phase technique unites with a vapor-deposited region 10v grown by a vapor-phase technique.

Herein, the vapor-phase technique is not particularly limited, but from the perspective of facilitating epitaxial growth, HVPE, metalorganic chemical vapor deposition (MOCVD), and molecular beam epitaxy (MBE) are preferable, for example. Furthermore, from the perspective of high crystal-growth rate, HVPE is particularly preferable.

Embodiment Mode 4

Referring to FIGS. 10A, 10B, 11B, and 11C, one embodiment mode of a III-nitride crystal substrate involving the present invention is III-nitride crystal substrates L1, L2, V1, V2, V3, V4, V5, V6, and V7 produced by processing a III-nitride crystal 10 manufactured by any of Embodiment Modes 1 through 3. Herein, the III-nitride crystal substrates L1 and L2 represent the substrates produced from the regions (first region 10s and second regions 10t) grown by a liquid-phase technique, and the III-nitride crystal substrates V1, V2, V3, V4, V5, V6, and V7 represent the substrates produced from the region (vapor-deposited region 10v) grown by a vapor-phase technique. Additionally, in the III-nitride crystal substrate L1, the III-nitride seed crystal serving as undersubstrate can be included.

The III-nitride crystal substrates produced in this manner are ideally suited to utilization as substrates for semiconductor devices, because at least the surface has—with dislocation density being low globally—a single polarity.

The III-nitride crystal processing method is not particularly limited, and may include, for example, a step of slicing or cleaving III-nitride crystal parallel to its principal face into the form of a plate. The step of slicing or cleaving makes it possible to readily produce plate-shaped III-nitride crystal substrates. Moreover, the III-nitride crystal processing method may include a step of grinding and/or polishing the principal face of the produced III-nitride crystal substrates. Also, a step of removing by reactive ion etching (RIE) or other vapor-phase etching a damaged layer on the principal face after the grinding and/or polishing may be further included. Onto the principal face of the III-nitride crystal substrates whose principal faces have been ground and/or polished, an at least single-lamina III nitride semiconductor layer having preferable crystallinity may be formed.

Embodiment Mode 5

Figure 12:
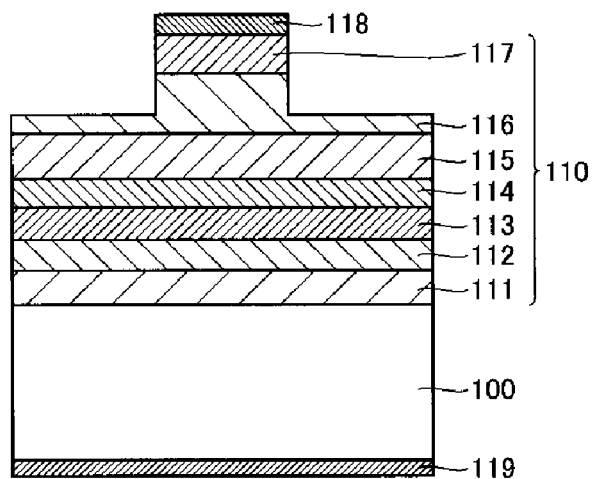
FIG. 12 is a sectional outline diagram illustrating one example of a III-nitride semiconductor device involving the present invention.
Figure 13:
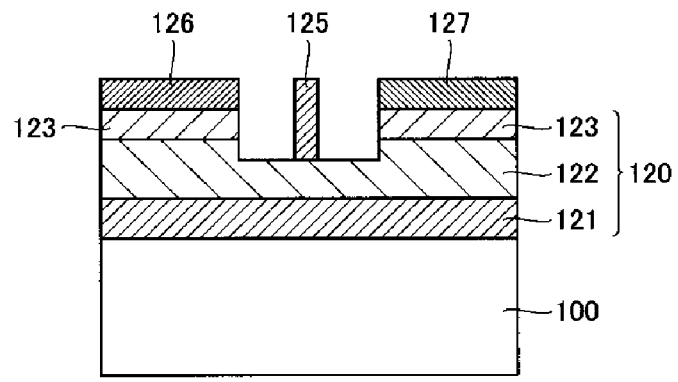
FIG. 13 is a sectional outline diagram illustrating another example of a III-nitride semiconductor device involving the present invention.

Referring to FIGS. 12 and 13, one embodiment mode of a III-nitride semiconductor device involving the present invention is a III-nitride semiconductor device in which an at least single-lamina III nitride semiconductor layer 110 or 120 is formed onto the III-nitride crystal substrate 100 of Embodiment Mode 4. The III-nitride semiconductor device has a III-nitride crystal substrate at least whose surface has—with dislocation density being low globally—a single polarity. Therefore, a III-nitride semiconductor layer formed onto this III-nitride crystal substrate has low dislocation density, satisfactory crystallinity, and enhanced properties. Examples of the III-nitride semiconductor device, a LD and HEMT are given below.

Embodiment Mode 5A

In an LD that is one example of the III-nitride semiconductor device involving the present invention, referring to FIG. 12, as the at least single-lamina III-nitride semiconductor layer 110, the following layers are formed successively onto a first principal face of the III-nitride crystal substrate 100 at least whose surface has—with dislocation density being low globally—a single polarity: an n-type $Al_{0.1}Ga_{0.9}N$ cladding layer 111; an n-type GaN guide layer 112; a multiquantum well active layer 113 (emission layer) composed of four pairs of InGaN/GaN layers; a p-type $Al_{0.2}Ga_{0.8}N$ protective layer 114; a p-type GaN guide layer 115; a p-type $Al_{0.1}Ga_{0.9}N$ cladding layer 116; and a p-type GaN contact layer 117. Onto the p-type GaN contact layer 117, a PdAu alloy electrode is formed as a p-side electrode 118. Herein, mesa-etching through the p-side electrode 118, the p-type GaN contact layer 117, and to a depth into the p-type $Al_{0.1}Ga_{0.9}N$ cladding layer 116 is carried out to form a ridge portion. Additionally, a Ti/Al alloy electrode is formed as an n-side electrode 119 onto a second principal face of the III-nitride crystal substrate 100.

Embodiment Mode 5B

In the HEMT that is another example of the III-nitride semiconductor device involving the present invention, referring to FIG. 13, as the at least single-lamina III-nitride semiconductor layer 120, the following layers are formed successively onto a first principal face of a III-nitride crystal substrate 100 at least whose surface has—with dislocation density being low globally—a single polarity: an undoped $Al_{0.26}Ga_{0.74}N$ spacer layer 121; a Si-doped n-type $Al_{0.26}Ga_{0.74}N$ carrier supply layer 122; and a Si-doped n-type GaN contact layer 123. Onto the Si-doped n-type GaN contact layer 123, Ti/Al serving as a source electrode 126 and a drain electrode 127 is formed by electron beam evaporation, and is alloyed by heat treatment, to form Ti/Al alloy electrodes. Furthermore, a central portion of the Ti/Al alloy electrodes, of the Si-doped n-type GaN contact layer 123, and of a part of the Si-doped n-type $Al_{0.26}Ga_{0.74}N$ carrier supply layer 122 is removed by recess-etching into the form of a stripe, and onto the exposed Si-doped n-type $Al_{0.26}Ga_{0.74}N$ carrier supply layer 122, a Pt/Ti/Au layer-laminated electrode is formed as a gate electrode 125 by electron beam evaporation so as not to contact with the source electrode 126 and drain electrode 127. Herein, in the gate electrode 125, the Pt/Ti/Au layers are formed successively from the side of the Si-doped n-type $Al_{0.26}Ga_{0.74}N$ carrier supply layer 122.

EMBODIMENTS

Embodiment 1

(1) Undersubstrate Preparation

Referring to FIGS. 1 and 3, a GaN seed crystal that was 2 inches (50.8 mm) in diameter and 350 μm in thickness, and that had a matrix 1s with a dislocation density of $1 \times 10^4$ to $1 \times 10^5$ cm$^{-2}$ and inversion domains 1t with a dislocation density of $1 \times 10^8$ to $1 \times 10^9$ cm$^{-2}$ was prepared as an undersubstrate 1. The surface of the matrix 1s of the undersubstrate 1 was the (0001) plane, and the surface of the inversion domains 1t was the (000-1) plane. Furthermore, the inversion domains 1t were in the form of a plurality of stripe domains $1t_a$ and $1t_b$ along the (0001) plane on the undersubstrate 1, with the striped domains $1t_a$ and $1t_b$ each having width W of 50 μm, and being arranged parallel to each other with pitch P of 300 μm. Moreover, the stripe orientation of each of the striped domains $1t_a$ and $1t_b$ paralleled the <1-100> directions.

Additionally, the undersubstrate 1 in Embodiment 1 was produced by, based on the growth method set forth in Patent Document 1, growing GaN crystal by HVPE onto a GaAs substrate in which mask layers in the form of a plurality of stripes were formed onto the (111) A-face. Herein, the striped mask layers each had width of 50 μm, and were arranged parallel to each other with pitch of 300 μm. Moreover, the stripe orientation of each of the striped mask layers paralleled the <11-2> directions in the GaAs substrate. That is, the inversion domains 1t of the GaN crystal were formed onto the striped mask layers in the GaAs substrate, and the matrix 1s was formed onto the GaAs substrate except where the mask layers were formed.

(2) III-Nitride Crystal Growth by Liquid-Phase Technique

GaN crystal, or a III-nitride crystal 10 was grown onto the above undersubstrate 1 by solution deposition. Specifically, in an $Al_2O_3$ crucible (reaction vessel 7) that was 52 mm in inner diametric span and 30 mm in height, with the undersubstrate 1 being placed on the crucible bottom, metal Ga of 12 g was put, and heated to form a Ga melt (crystal-growth solution 2) on the undersubstrate 1. Next, temperatures of the undersubstrate 1 and Ga melt (crystal-growth solution 2) were brought to 950° C., and a $N_2$ gas was supplied as a nitrogen-containing gas 3 to the Ga melt (crystal-growth solution 2) to bring the $N_2$ gas pressure to 6.078 MPa (60 atmospheres), to grow the GaN crystal (III-nitride crystal 10) for 100 hours. After being cooled, residual Ga in the crucible was removed with hydrochloric acid, and then the GaN crystal (III-nitride crystal 10) growing onto the undersubstrate 1 to unite with it was picked out. The GaN crystal thickness was 3 μm.

(3) III Nitride Crystal Evaluation

The GaN crystal (III-nitride crystal 10) uniting with the undersubstrate 1 was observed for polarity and dislocation density in the following manner.

The GaN crystal uniting with undersubstrate was immersed in a phosphoric-sulfuric acid mixed solution, heated to 250° C. to etch it for one hour, and observed under an optical microscope. The observation result proved that the portions grown onto the inversion domains 1t of the undersubstrate 1 also had a tendency to stand etching, as the other portion. Furthermore, observing the GaN crystal uniting with undersubstrate under a fluorescence microscope revealed that any zone looking like reflecting an inversion of the GaN crystal polarity—that is, any zone in which emission was changed was not found. These results confirmed that as to the surface of the GaN crystal uniting with undersubstrate, the entire surface was made the Ga face (the (0001) plane)—that is, the entire surface had a single polarity.

Moreover, as a result of observation by cathodoluminescence, the surface dislocation density in the GaN crystal uniting with undersubstrate was a low $1 \times 10^4$ to $1 \times 10^5$ cm$^{-2}$ uniformly across the entire surface.

From the above-noted results it could be confirmed that GaN crystal united with an undersubstrate of Embodiment 1 was crystal, in GaN crystal of 3 μm thickness, in which at least the surface had a single polarity, and the dislocation density was low globally.

(4) LD Fabrication

Referring to FIG. 12, GaN crystal uniting with such an undersubstrate was utilized as a III-nitride crystal substrate 100, and an at least single-lamina III-nitride semiconductor layer 110 was formed onto the III-nitride crystal substrate 100, to fabricate LDs, next.

Specifically, the III-nitride crystal substrate 100 was polished, and a damaged layer on the substrate surface was removed by reactive ion etching (RIE). Subsequently, as the III-nitride semiconductor layer 110, the following layers were formed successively onto a first principal face of the III-nitride crystal substrate 100: an 3 μm-thick n-type $Al_{0.1}Ga_{0.9}N$ cladding layer 111; a 0.1 μm-thick n-type GaN guide layer 112; a 0.05 μm-thick multiquantum well active layer 113 (emission layer) composed of four pairs of InGaN/GaN layers; a 0.02 μm-thick p-type $Al_{0.2}Ga_{0.8}N$ protective layer 114; a 0.1 μm-thick p-type GaN guide layer 115; a 0.4 μm-thick p-type $Al_{0.1}Ga_{0.9}N$ cladding layer 116; and a 0.1 μm-thick p-type GaN contact layer 117. The formation of the III-nitride semiconductor layer 110 was carried out by MOCVD with substrate temperature being made 1080° C., utilizing: a trimethyl gallium and trimethylaluminum gases as III element source gas; an ammonia gas as nitrogen source gas; a hydrogen gas as carrier gas; a silane gas as n-type dopant gas; and magnesium as a p-type dopant.

Next, that parts of the p-type GaN contact layer 117 which were formed on both edges and a part of the p-type $Al_{0.1}Ga_{0.9}N$ cladding layer 116 were removed by mesa-etching to form a ridge with ridge stripe width of 2 μm. Subsequently, a Pd/Au alloy electrode was formed as a p-side electrode 118 onto the p-type GaN contact layer 117 by electron beam evaporation and heat treatment.

Next, a second principal face of the III-nitride crystal substrate 100 was polished to bring the substrate thickness to 100 μm, and then a Ti/Al alloy electrode was formed as an n-side electrode 119 onto the second principal face by electron beam evaporation and heat treatment.

After that, the wafer in which the III-nitride semiconductor layer 110 and p-side electrode 118 were formed onto the first principal face of the III-nitride crystal substrate 100 and the n-side electrode 119 was formed onto the second principal face was divided into square chips having of 300 μm to fabricate LDs. From the wafer that was 2 inches (50.8 mm) in diameter, 1,000 LDs were fabricated. These LDs were the blue-violet LDs having threshold current of 45 mA and oscillation wavelength of 405 nm. In a life test on these LDs—in the test, the LDs were oscillated on power of 30 mW under an atmosphere having temperature of 60° C.—qualified LDs whose lifetimes were estimated to be 10,000 hours or more were obtained at yield of 80%.

Comparative Example 1

The undersubstrate 1 employed in Embodiment 1 (that is, the GaN seed crystal that is 2 inches (50.8 mm) in diameter and 350 μm in thickness, having the matrix 1s with a dislocation density of $1 \times 10^4$ to $1 \times 10^5$ $cm^{-2}$ and the inversion domains 1t with a dislocation density of $1 \times 10^8$ to $1 \times 10^9$ $cm^{-2}$) was utilized as a III-nitride crystal substrate 100 to fabricate LDs in the same manner as in Embodiment 1. In the LD fabrication, it was made sure that a ridge portion was formed in a region right above the matrix 1s.

From the wafer that was 2 inches (50.8 mm) in diameter, 1,000 blue-violet LDs having oscillation wavelength of 405 nm were fabricated. As a result of carrying out the same life test as in Embodiment 1 on these LDs, qualified-LD yield was 10%. Analyzing broken-down LDs proved that in most of the parts formed onto inversion domains 1t in a III-nitride semiconductor layer formed onto the undersubstrate 1, the polarity was inverted. Furthermore, in the part formed onto a matrix 1s in the III-nitride semiconductor layer formed on the undersubstrate 1, unusual growth—for example, the edges of the part rose—occurred.

Comparative Example 2

(1) Undersubstrate Preparation

A GaN crystal substrate fabricated by ELO of Patent Document 2 was prepared as an undersubstrate. Specifically, a mask composed of $SiO_2$ film was formed by chemical vapor deposition (CVD) onto a substrate in which a 1 μm-thick GaN layer was formed by MOCVD onto the (0001) plane on a sapphire substrate that was 2 inches (50.8 mm) in diameter and 300 μm in thickness to pattern the mask into the form of stripes by photolithography and wet-etching. The left striped masks each had mask width of 5 μm, and were arranged with pitch of 7 μm, with the stripe orientation being in the <11-20> directions in the GaN crystal.

Next, the substrate with the striped masks was inserted into a HVPE apparatus, and with temperature being raised to 1,000° C. under a $H_2$ gas atmosphere, a GaCl and $NH_3$ gases were supplied for 25 minutes respectively at 20 sccm (hereinafter, 1 sccm is 1,013 hPa, which means the flow rate at which a gas at 0° C. in standard condition flows 1 $cm^3$ for one minute) and at 1,000 sccm to laterally grow GaN crystal growing through the openings of the striped masks. Furthermore, the GaN crystal was grown for 10 hours to obtain 400 μm-thick GaN crystal in which the entire surface was planar.

Subsequently, after being cooled, the GaN crystal was picked out from the HVPE apparatus, and third harmonics (wavelength of 355 nm) of yttrium aluminum garnet laser (YAG laser) were radiated at the entire surface from the sapphire substrate side to decompose a GaN layer lying at the interface between the GaN crystal and the sapphire substrate, separating the GaN crystal from the sapphire substrate. Successively, the both faces of the GaN crystal were polished to produce 360 μm-thick GaN crystal.

The produced GaN crystal was immersed in a phosphoric-sulfuric acid mixed solution, heated to 250° C. to etch it for one hour, and observed under an optical microscope. As a result, the entire surface of the GaN crystal was proved to be the Ga face ((0001) plane). Furthermore, observation by CL revealed that the surface dislocation density in the GaN crystal was $1 \times 10^7$ to $1 \times 10^8$ $cm^{-2}$. The surface of the above GaN crystal was polished to produce a 350 μm-thick GaN crystal substrate.

(2) III-Nitride Crystal Growth by Liquid-Phase Technique

A GaN crystal (III-nitride crystal 10) was grown onto the above GaN crystal substrate (undersubstrate 1) by solution deposition for 100 hours under the same conditions as in Embodiment 1, and the GaN crystal (III-nitride crystal 10) united with the undersubstrate 1 in the same manner as in Embodiment 1 was picked out. The GaN crystal thickness was 3 μm.

(3) III-Nitride Crystal Evaluation

The GaN crystal (III-nitride crystal 10) uniting with undersubstrate was observed under an optical and fluorescence microscopes after the same etching as in Embodiment 1, which proved that the entirety of the crystal surface was the Ga face ((0001) plane), and had a single polarity. Moreover, observation by CL revealed that dislocation density in the GaN crystal (III-nitride crystal 10) uniting with undersubstrate was a high $1 \times 10^7$ to $1 \times 10^8$ $cm^{-2}$.

(4) LD Fabrication

The GaN crystal uniting with undersubstrate was utilized as a III-nitride crystal substrate 100 to fabricate 1,000 LDs in the same manner as in Embodiment 1. The lifetime of the LDs, however, could not be measured because all of the fabricated LDs did not oscillate on power of 30 mW even under a room temperature atmosphere (for example, 25° C.). Therefore, qualified-LD yield was 0%.

Embodiment 2

(1) Undersubstrate Preparation

Referring to FIGS. 1 and 4, GaN seed crystal that was 2 inches (50.8 mm) in diameter and 350 μm in thickness, having a matrix 1s with a dislocation density of $1 \times 10^4$ to $1 \times 10^5$ cm$^{-2}$ and inversion domains 1t with a dislocation density of $1 \times 10^8$ to $1 \times 10^9$ cm$^{-2}$ was prepared as an undersubstrate 1. The surface of the matrix 1s of the undersubstrate 1 was the (0001) plane, and the surface of the inversion domains 1t was the (000-1) plane. Furthermore, the inversion domains 1t were in the form of a plurality stripe domains 1$t_a$ and 1$t_b$ along the (0001) plane on the undersubstrate 1, with the striped domains 1$t_a$ and 1$t_b$ each having width W of 50 μm, and being arranged parallel to each other with pitch P of 300 μm. Furthermore, the stripe orientation of each of the striped domains 1$t_a$ and 1$t_b$ paralleled the <11-20> directions.

Additionally, the undersubstrate in Embodiment 2 was produced by, based on the growth method set forth in Patent Document 1, growing GaN crystal by HVPE onto a GaAs substrate in which mask layers in the form of a plurality of stripes were formed on the (111) A-face. Herein, the striped mask layers each had thickness of 50 μm, and were arranged parallel to each other with pitch of 300 μm. Furthermore, the stripe orientation of each of the striped mask layers paralleled the <-110> directions in the GaAs substrate. That is, the inversion domains 1t of the GaN crystal were formed onto the striped mask layers in the GaAs substrate, and the matrix 1s was formed onto the GaAs substrate except where the mask layers were formed.

(2) III-Nitride Crystal Growth by Liquid-Phase Technique

GaN crystal (III-nitride crystal 10) was grown onto the above undersubstrate 1 by solution deposition for 100 hours under the same conditions as in Embodiment 1, and the GaN crystal (III-nitride crystal 10) united with the undersubstrate 1 in the same manner as in Embodiment 1 was picked out. The GaN crystal thickness was 3 μm.

(3) III-Nitride Crystal Evaluation

The GaN crystal (III-nitride crystal 10) uniting with undersubstrate was observed under an optical and fluorescence microscopes after the same etching as in Embodiment 1, which proved that the entirety of the crystal surface was the Ga face ((0001) plane), and had a single polarity. Moreover, observation by CL revealed that dislocation density in the GaN crystal (III-nitride crystal 10) uniting with undersubstrate was a low $1 \times 10^4$ to $1 \times 10^5$ cm$^{-2}$ uniformly across the crystal surface globally.

From the above-noted results it could be confirmed that GaN crystal united with an undersubstrate of Embodiment 2 was crystal, in GaN crystal of 3 μm thickness, in which at least the surface had a single polarity, and the dislocation density was low globally.

Embodiment 3

(1) Undersubstrate Preparation

Referring to FIGS. 1 and 5, GaN seed crystal that was 2 inches (50.8 mm) in diameter and 350 μm in thickness, having a matrix 1s with a dislocation density of $1 \times 10^4$ to $1 \times 10^5$ cm$^{-2}$ and inversion domains 1t with a dislocation density of $1 \times 10^8$ to $1 \times 10^9$ cm$^{-2}$ was prepared as an undersubstrate 1. The surface of the matrix 1s of the undersubstrate 1 was the (0001) plane, and the surface of the inversion domains 1t was the (000-1) plane. Furthermore, the inversion domains 1t were in the form of a plurality of stripe domains 1$t_a$ and 1$t_b$ along the (0001) plane on the undersubstrate 1, with the striped domains 1$t_a$ and 1$t_b$ each having width W of 50 μm, and being arranged parallel to each other with pitch P of 300 μm. Moreover, the stripe orientation of each of the striped domains 1$t_a$ and 1$t_b$ paralleled the direction rotated 45° in the <11-20> directions with respect to the <1-100> directions.

Additionally, the undersubstrate in Embodiment 3 was produced by, based on the growth method set forth in Patent Document 1, growing GaN crystal by HVPE onto a GaAs substrate in which mask layers in the form of a plurality of stripes were formed on the (111) A-face. Herein, the striped mask layers each had width of 50 μm, and were arranged parallel to each other with pitch of 300 μm. Moreover, the stripe orientation of each of the striped mask layers paralleled the direction rotated 45° in the <-100> directions with respect to the <11-2> directions in the GaAs substrate. That is, the inversion domains it of the GaN crystal were formed onto the striped mask layers of the GaAs substrate, and matrix 1s was formed onto the GaAs substrate except where the mask layers were formed.

(2) III-Nitride Crystal Growth by Liquid-Phase Technique

GaN crystal (III-nitride crystal 10) was grown onto the above undersubstrate 1 by solution deposition for 200 hours under the same conditions as in Embodiment 1, and the GaN crystal (III-nitride crystal 10) united with the undersubstrate 1 in the same manner as in Embodiment 1 was picked out. The GaN crystal thickness was 6 μm.

(3) III Nitride Crystal Evaluation

The GaN crystal (III-nitride crystal 10) uniting with undersubstrate was observed under an optical and fluorescence microscopes after the same etching as in Embodiment 1, which proved that the entirety of the crystal surface was the Ga face ((0001) plane), and had a single polarity. Moreover, observation by CL revealed that dislocation density in the GaN crystal (III-nitride crystal 10) uniting with undersubstrate was a low $1 \times 10^4$ to $1 \times 10^5$ cm$^{-2}$ uniformly across the crystal surface globally.

From the above-noted results it could be confirmed that GaN crystal united with an undersubstrate of Embodiment 3 was crystal, in GaN crystal of 6 μm thickness, in which at least the surface had a single polarity, and the dislocation density was low globally.

Embodiment 4

(1) Undersubstrate Preparation

Referring to FIGS. 1 and 5, the same GaN seed crystal as that in Embodiment 3 was prepared as an undersubstrate 1. Subsequently, this undersubstrate was immersed in a molten KOH solution, and was heated at 300° C. for 10 minutes. Herein, because the speed at which N face was etched with molten KOH is remarkably faster compared with the speed at which Ga face was etched with molten KOH, the undersubstrate 1 in which the surface of the inversion domains 1t was recessed by 20 μm relative to the surface of the matrix 1s, as illustrated in FIGS. 2 and 5, was produced.

(2) III-Nitride Crystal Growth

GaN crystal (III-nitride crystal 10) was grown onto the undersubstrate having the rough surface with the recesses of the inversion domains 1t, by solution deposition for 36 hours under the same conditions as in Embodiment 1, and the GaN crystal (III-nitride crystal 10) united with the undersubstrate 1 in the same manner as in Embodiment 1 was picked out. The GaN crystal thickness was 1 μm.

(3) III-Nitride Crystal Evaluation

The GaN crystal (III-nitride crystal 10) uniting with undersubstrate was observed under an optical and fluorescence microscopes after the same etching as in Embodiment 1, which proved that the entirety of the crystal surface was the Ga face ((0001) plane), and had a single polarity. Moreover, observation by CL revealed that dislocation density in the GaN crystal (III-nitride crystal 10) uniting with undersubstrate was a low $1\times10^4$ to $1\times10^5$ cm$^{-2}$ uniformly across the crystal surface globally.

From the above-noted results it could be confirmed that GaN crystal united with an undersubstrate of Embodiment 4 was crystal, in GaN crystal of 1 μm thickness, in which at least the surface had a single polarity, and the dislocation density was low globally.

Comparing Embodiment 4 with Embodiment 3 verified that recessing the inversion domains 1t of the undersubstrate 1 to grow the III-nitride crystal 10 gave higher priority to the growth of the first region 10s growing onto the matrix is over the growth of the second regions 10t growing onto the inversion domains 1t, decreasing the second region-covering crystal thickness, so that growth of thinner crystal—that is, crystal growth for shorter period of time—made it possible to produce III-nitride crystal having a single polarity, with the dislocation density at least in the surface being low globally.

Embodiment 5

(1) Undersubstrate Preparation

Referring to FIGS. 1 and 6, GaN seed crystal that was 2 inches (50.8 mm) in diameter and 350 μm in thickness, having a matrix 1s with a dislocation density of $1\times10^4$ to $1\times10^5$ cm$^{-2}$ and inversion domains 1t with a dislocation density of $1\times10^8$ to $1\times10^9$ cm$^{-2}$ was prepared as an undersubstrate 1. The surface of the matrix 1s of the undersubstrate 1 was the (0001) plane, and the surface of the inversion domains 1t was the (000-1) plane. Herein, the inversion domains 1t were in the form of a plurality of dot domains 1t$_m$ and 1t$_n$ along the (0001) plane on the undersubstrate 1, with the dotted domains 1t$_m$ and 1t$_n$ having diameter W of 50 μm each being arranged so that their centers were positioned respectively at the vertices of close-packed squares 1f, arranged two-dimensionally, having sides P of 300 μm. Furthermore, the orientation of either pair of facing sides of the squares 1f paralleled the <1-100> directions.

Additionally, the undersubstrate in Embodiment 5 was produced by, based on the growth method set forth in Patent Document 1, growing GaN crystal by HVPE onto a GaAs substrate in which mask layers in the form of a plurality of dots were formed on the (111) A-face. Herein, the dotted mask layers each had diameter of 50 μm, and were arranged so that their centers were positioned respectively at the vertices of close-packed squares, arranged two-dimensionally, having sides P of 300 μm. Moreover, the orientation of either pair of facing sides of the squares 1f paralleled the <11-2> directions in the GaAs substrate. That is, the inversion domains 1t of the GaN crystal were formed onto the mask layers of the GaAs substrate, and matrix 1s was formed onto the GaAs substrate except where the mask layers were formed.

(2) III-Nitride Crystal Growth by Liquid-Phase Technique

GaN crystal (III-nitride crystal 10) was grown onto the above undersubstrate 1 by solution deposition for 100 hours under the same conditions as in Embodiment 1, and the GaN crystal (III-nitride crystal 10) united with the undersubstrate 1 in the same manner as in Embodiment 1 was picked out. The GaN crystal thickness was 3 μm.

(3) III-Nitride Crystal Evaluation

The GaN crystal (III-nitride crystal 10) uniting with undersubstrate was observed under an optical and fluorescence microscopes after the same etching as in Embodiment 1, which proved that the entirety of the crystal surface was the Ga face ((0001) plane), and had a single polarity. Moreover, observation by CL revealed that dislocation density in the GaN crystal (III-nitride crystal 10) uniting with undersubstrate was a low $1\times10^4$ to $1\times10^5$ cm$^{-2}$ uniformly across the crystal surface globally.

From the above-noted results it could be confirmed that GaN crystal united with an undersubstrate of Embodiment 5 was crystal, in GaN crystal of 3 μm thickness, in which at least the surface had a single polarity, and the dislocation density was low globally.

Embodiment 6

(1) Undersubstrate Preparation

Referring to FIGS. 1 and 7, GaN seed crystal that was 2 inches (50.8 mm) in diameter and 350 μm in thickness, having a matrix 1s with a dislocation density of $1\times10^4$ to $1\times10^5$ cm$^{-2}$ and inversion domains 1t with a dislocation density of $1\times10^8$ to $1\times10^9$ cm$^{-2}$ was prepared as an undersubstrate 1. The surface of the matrix 1s of the undersubstrate 1 was the (0001) plane, and the surface of the inversion domains 1t was the (000-1) plane. Herein, the inversion domains 1t were in the form of a plurality of dot domains 1t$_m$ and 1t$_n$ along the (0001) plane, with the dotted domains 1t$_m$ and 1t$_n$ having diameter W of 50 μm each being arranged so that their centers were positioned respectively at the vertices of close-packed regular triangles 1g, arranged two-dimensionally, having sides P of 300 μm. Furthermore, the orientation of all three sides of the regular triangles 1g paralleled the <1-100> directions.

Additionally, the undersubstrate in Embodiment 6 was produced by, based on the growth method set forth in Patent Document 1, growing GaN crystal by HVPE onto a GaAs substrate in which mask layers in the form of a plurality of dots were formed on the (111) A-face. Herein, the dotted mask layers each had diameter of 50 μm, and were arranged so that their centers were positioned respectively at the vertices of close-packed regular triangles, arranged two-dimensionally, having sides P of 300 μm. Moreover, the orientation of any one side of each of the regular triangles paralleled the <11-2> directions in the GaAs substrate. That is, the inversion domains 1t of the GaN crystal were formed onto the dotted mask layers on the GaAs substrates, and matrix 1s was formed onto the GaAs substrate except where the mask layers were formed.

(2) III-Nitride Crystal Growth by Liquid-Phase Technique

GaN crystal was grown onto the above undersubstrate 1 by solution deposition under temperature and pressure conditions higher than in Embodiment 1, utilizing as material for the reaction vessel 7 pBN that was high-purity material for crucible. Specifically, with growth temperature being brought to 1,500° C., and with N$_2$ gas pressure being brought to 1.5 GPa (approximately 15,000 atmospheres), the GaN crystal (III-nitride crystal 10) was grown for 200 hours, and the GaN crystal (III-nitride crystal 10) united with the undersubstrate 1 in the same manner as in Embodiment 1 was picked out. The GaN crystal thickness was 650 μm.

(3) III-Nitride Crystal Evaluation

Referring to FIG. 10, the 1,000 μm-thick GaN crystal (III nitride crystal 10) united with the undersubstrate 1 was sliced with a slicer into two slices, which were each polished along the side grown by solution deposition, and furthermore the surface-damaged layer on the Ga-face side was removed with RIE. As a result, one GaN crystal substrate (III-nitride crystal substrate L1) in which the 350 μm-thick undersubstrate having the matrix 1s and inversion domains 1t and solution-grown 100 μm-thick GaN crystal united together, and one 450 μm-thick GaN crystal substrate (III-nitride crystal substrate L2) composed of the region grown by solution deposition were produced.

Next, four-terminal Hall measurement was carried out on the Ga face sides of the substrates L1 and L2. The measurement results confirmed that the substrates both were high-resistivity substrates having a resistivity of $1 \times 10^5$ Ω·cm or more—that is, they both are substrates suitable for HEMT and other devices.

Furthermore, the substrates L1 and L2 were observed under an optical and fluorescence microscopes after the same etching as in Embodiment 1, which proved that the entirety of the substrate surfaces were the Ga face (the (0001) plane), and had a single polarity. Moreover, observation by CL revealed that dislocation density in the substrates L1 and L2 (III-nitride crystal 10) was a low $1 \times 10^4$ to $1 \times 10^5$ cm$^{-2}$ uniformly across the substrate surfaces globally.

From the above-noted results it could be confirmed that the GaN crystal substrates (substrates L1 and L2) of Embodiment 6 were crystal in which at least the surface had a single polarity, and the dislocation density was low globally.

(4) HEMT Fabrication

Referring to FIG. 13, such high-resistivity GaN crystal substrates were utilized as III-nitride crystal substrates 100, and an at least single-lamina III-nitride semiconductor layer 120 was formed onto the III-nitride crystal substrates 100, to fabricate HEMTs.

Specifically, the III-nitride crystal substrates 100 were polished, and a damaged layer on the substrate surfaces was removed. Next, as the III-nitride semiconductor layer 120, the following layers were formed successively onto the principal face of the III-nitride crystal substrates 100: a 10 nm-thick undoped $Al_{0.26}Ga_{0.74}N$ spacer layer 121; a 20 nm-thick Si-doped n-type $Al_{0.26}Ga_{0.74}N$ carrier supply layer 122; and a 20 nm-thick Si-doped n-type GaN contact layer 123. The formation of the III-nitride semiconductor layer 120 was carried out by MOCVD with the substrate temperature being brought to 1,100° C., utilizing: a trimethyl gallium and trimethylaluminum gases as III-element source gas; an ammonia gas as nitrogen source gas; a hydrogen gas as carrier gas; and a silane gas as doping gas.

Next, as a source electrode 126 and drain electrode 127, Ti/Al layers were evaporated respectively to thickness of 25 nm/150 nm onto the Si-doped n-type GaN contact layer 123, and were alloyed by heat treatment. After they were alloyed, the central portion of the wafer was recess-etched by RIE into the form of a stripe. Subsequently, a Pt layer (10 nm in thickness)/Ti layer (40 nm in thickness)/Au layer (100 nm in thickness) were formed as a gate electrode 125 onto the Si-doped n-type $Al_{0.26}Ga_{0.74}N$ carrier supply layer 122 exposed by the above recess-etching, between the source electrode 126 and the drain electrode 127. In the gate electrode 125, the gate length and width were made respectively 2 μm and 14 μm, and the interval between the source electrode 126 and the drain electrode 127 was made 10 μm.

Being fabricated on the GaN crystal substrate (III-nitride crystal substrate 100) whose surface was planar, and was low in dislocation density, the HEMTs had an extremely sharp interface, and observing the interface profile under a transmission electron microscope (TEM) proved the interface profile to be planarized to a level of atomic layer. The properties of the HEMTs at a room temperature (for example, 300 K) were 160 mS/mm transconductance and 1.1 A/mm drain electric current, which meant that the devices of highly enhanced properties could be fabricated.

Embodiment 7

(1) Undersubstrate Preparation

Referring to FIGS. 1 and 8, GaN seed crystal that was 2 inches (50.8 mm) in diameter and 350 μm in thickness, having a matrix 1s with a dislocation density of $1 \times 10^4$ to $1 \times 10^5$ cm$^{-2}$ and inversion domains 1t with a dislocation density of $1 \times 10^8$ to $1 \times 10^9$ cm$^{-2}$ was prepared as an undersubstrate 1. The surface of the matrix 1s of the undersubstrate 1 was the (0001) plane, and the surface of the inversion domains 1t was the (000-1) plane. Herein, the inversion domains 1t were in the form of a honeycomb whose width W was 50 μm, and whose central lines lay on the six sides of closed-packed regular hexagons 1h two-dimensionally along the (0001) plane, having sides L of 300 μm. Furthermore, the orientation of all six sides paralleled the <11-20> directions.

Additionally, the undersubstrate in Embodiment 7 was produced by, based on the growth method set forth in Patent Document 1, growing GaN crystal by HVPE onto a GaAs substrate in which mask layers were formed on a honeycomb whose width W was 50 μm, and whose central lines lay on the six sides of the close-packed regular hexagons 1h two-dimensionally along the (111) A-face, having sides L of 300 μm. Herein, the orientation of any one pair of facing sides of the above regular hexagons paralleled the <-110> directions in the GaAs substrate. That is, the inversion domains 1t of the GaN crystal were formed onto the mask layers in the GaAs substrate, and the matrix 1s was formed onto the GaAs substrate except where the mask layers were formed.

(2) III-Nitride Crystal Growth by Liquid-Phase Technique

GaN crystal (III-nitride crystal 10) was grown onto the above undersubstrate 1 by solution deposition for 200 hours under the same conditions as in Embodiment 1, and the GaN crystal (III-nitride crystal 10) united with the undersubstrate 1 in the same manner as in Embodiment 1 was picked out. The GaN crystal thickness was 6 μm.

(3) III-Nitride Crystal Evaluation

The GaN crystal (III-nitride crystal 10) uniting with undersubstrate was observed under an optical and fluorescence microscopes after the same etching as in Embodiment 1, which proved that the entirety of the crystal surface was the Ga face ((0001) plane), and had a single polarity. Moreover, observation by CL revealed that dislocation density in the GaN crystal (III-nitride crystal 10) uniting with undersubstrate was a low $1 \times 10^4$ to $1 \times 10^5$ cm$^{-2}$ uniformly across the crystal surface globally.

From the above-noted results it could be confirmed that GaN crystal united with an undersubstrate of Embodiment 7 was crystal, in GaN crystal of 6 μm thickness, in which at least the surface had a single polarity, and the dislocation density was low globally.

Embodiment 8

(1) Undersubstrate Preparation

Referring to FIGS. 1 and 9, GaN seed crystal that was 2 inches (50.8 mm) in diameter and 350 μm in thickness, having a matrix 1s with a dislocation density of $1 \times 10^4$ to $1 \times 10^5$ cm$^{-2}$ and inversion domains 1t with a dislocation density of $1 \times 10^8$ to $1 \times 10^9$ cm$^{-2}$ was prepared as an undersubstrate 1. The surface of the matrix 1s of the undersubstrate 1 was the (0001) plane, and the surface of the inversion domains 1t was the (000-1) plane. Herein, the inversion domains 1t were in the form of a honeycomb whose width W was 50 μm, and whose central lines lay on the six sides of close-packed regular hexagons 1h two dimensionally along the (0001) plane, having sides L of 300 μm. Furthermore, the orientation of any of the six sides all paralleled the <1-100> directions.

Additionally, the undersubstrate in Embodiment 8 was produced by, based on the growth method set forth in Patent Document 1, growing GaN crystal by HVPE onto a GaAs substrate in which mask layers were formed on a honeycomb whose width W was 50 μm, and whose central lines lay on the six sides of the close-packed regular hexagons 1h two-dimensionally along the (111) A-face, having sides L of 300 μm. Herein, the orientation of any one pair of facing sides of the above regular hexagons paralleled the <11-2> directions in the GaAs substrate. That is, the inversion domains 1t of the GaN crystal were formed onto the mask layers in the GaAs substrate, and the matrix 1s was formed onto the GaAs substrate except where the mask layers were formed.

(2) III-Nitride Crystal Growth by Liquid-Phase Technique

GaN crystal (III-nitride crystal 10) was grown onto the above undersubstrate 1 by solution deposition for 200 hours under the same conditions as in Embodiment 1, and the GaN crystal (III-nitride crystal 10) united with the undersubstrate 1 in the same manner as in Embodiment 1 was picked out. The GaN crystal thickness was 6 μm.

(3) III-Nitride Crystal Evaluation

The GaN crystal (III-nitride crystal 10) uniting with undersubstrate was observed under an optical and fluorescence microscopes after the same etching as in Embodiment 1, which proved that the entirety of the crystal surface was the Ga face ((0001) plane), and had a single polarity. Moreover, observation by CL revealed that dislocation density in the GaN crystal (III-nitride crystal 10) uniting with undersubstrate was a low $1 \times 10^4$ to $1 \times 10^5$ cm$^{-2}$ uniformly across the crystal surface globally.

From the above-noted results it could be confirmed that GaN crystal united with an undersubstrate of Embodiment 8 was crystal, in GaN crystal of 6 μm thickness, in which at least the surface had a single polarity, and the dislocation density was low globally.

Embodiment 9

(1) Undersubstrate Preparation

The same undersubstrate as in Embodiment 1 was prepared.

(2) III-Nitride Crystal Growth by Liquid-Phase Technique

GaN crystal (III-nitride crystal 10) was grown onto the above undersubstrate by solution deposition for 200 hours under the same conditions as in Embodiment 1, and the GaN crystal (III-nitride crystal 10) united with the undersubstrate 1 in the same manner as in Embodiment 1 was picked out. The GaN crystal thickness was 6 μm.

(3) III-Nitride Crystal Growth by Vapor-Phase Technique

Referring to FIGS. 11A and 11B, the GaN crystal (III-nitride crystal 10) grown onto the undersubstrate 1 by solution deposition to unite with the undersubstrate 1 was further grown for 35 hours by HVPE to further thicken the GaN crystal by 3,500 μm. Herein, as dopant gas, a $SiCl_2H_2$ gas was utilized.

(4) III-Nitride Crystal Substrate Fabrication

Figure 11C:
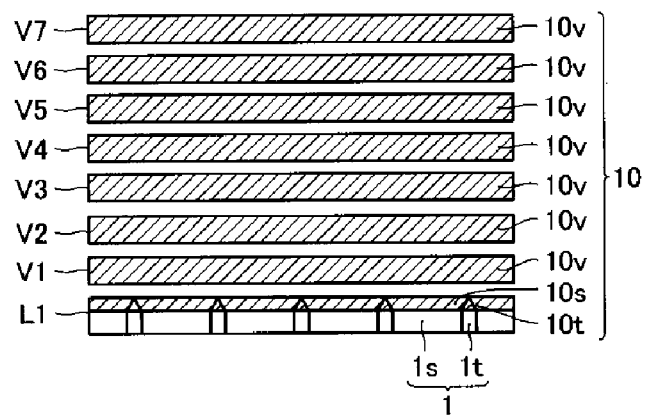
FIG. 11C, in a sectional outline diagram illustrating this yet other embodiment mode of a III-nitride crystal manufacturing method involving the present invention, represents a step of forming III-nitride crystal substrates.

Referring to FIGS. 11B and 11C, the GaN crystal (III-nitride crystal 10) grown onto the undersubstrate 1 by solution deposition, and subsequently by HVPE to unite with the undersubstrate 1 was sliced into eight with a slicer. The eight slices of the GaN crystal were each polished from the both faces grown by solution deposition or by HVPE,[10] and furthermore a damaged layer on the Ga face side was removed by RIE. In this manner, eight 355 μm-thick GaN crystal substrates (III-nitride crystal substrates L1, V1, V2, V3, V4, V5, V6, and V7) were produced. Herein, the substrate L1 was produced from the undersubstrate 1 and from the region grown by a liquid-phase technique (that is, the first region 1s and second regions 1t), and the substrates V1, V2, V3, V4, V5, V6, and V7 were produced from the region grown by a vapor-phase technique (that is, from the vapor-deposited region 10v). Herein, the region grown by a liquid-phase technique in the substrate L1 has thickness of 5 μm.

As a result of evaporating an electrode onto the substrates' Ga faces to carry out Hall measurement, all of the substrates L1, V1, V2, V3, V4, V5, V6, and V7 were proven to have resistivity of 0.01 Ω·cm, and were confirmed to be conductive substrates suitable for blue-violet laser and other optical devices.

(5) LD Fabrication

The substrates L1, V1, V2, V3, V4, V5, V6, and V7 were utilized as III-nitride crystal substrates 100 to fabricate 1,000 LDs from each of the substrates in the same manner as in Embodiment 1. Carrying out the same life test as in Embodiment 1 on the LDs proved that as to all the substrates, qualified-LD yield was a high 80%.

The embodiments and implementations that have been disclosed here are illustrative by nature are should not be regarded as limiting. The scope of the invention is defined by its claims rather than the foregoing description, and should be understood to include the features of the claims of the invention and equivalents thereof, in addition to all changes falling within the scope of the claims.

The invention claimed is:

1. A III-nitride crystal manufacturing method, including:
   a step of preparing an undersubstrate containing a III-nitride seed crystal, the III-nitride seed crystal having a matrix, and inversion domains in which the polarity in the <0001> directions is inverted with respect to the matrix; and
   a step of growing a III-nitride crystal onto the matrix and inversion domains of the undersubstrate by a liquid-phase technique; characterized in that
   a first region, being where the growth rate of III-nitride crystal growing onto the matrix is greater, covers second regions, being where the growth rate of III-nitride crystal growing onto the inversion domains is lesser.

2. The III-nitride crystal manufacturing method set forth in claim 1, characterized in that in the undersubstrate, the surface of the inversion domains is recessed relative to the matrix surface.

3. The III-nitride crystal manufacturing method set forth in claim 1 or claim 2, characterized in that along a {0001} plane on the undersubstrate, the inversion domains are in the form of a plurality of stripe regions, with the striped regions being arranged parallel to each other at regular intervals.

4. The III-nitride crystal manufacturing method set forth in claim 1 or claim 2, characterized in that along a {0001} plane on the undersubstrate, the inversion domains are in the form of a plurality of dot regions, with the dotted regions being arranged two-dimensionally at regular intervals.

5. The III-nitride crystal manufacturing method set forth in claim 1 or claim 2, characterized in that along a {0001} plane on the undersubstrate, the inversion domains are in a honeycomb form, arranged two-dimensionally in closed-packed regular hexagons.

6. The III-nitride crystal manufacturing method set forth in claim 1 or claim 2, characterized in that the III-nitride crystal is grown to a thickness of 1 μm or more.

7. The III-nitride crystal manufacturing method set forth in claim 1 or claim 2, characterized in that the resistivity of the III-nitride crystal is in its surface is $1\times10^5$ Ω·cm or more.

8. The III-nitride crystal manufacturing method set forth in claim 1 or claim 2, characterized in that the III-nitride crystal is grown in a nitride reaction vessel.

9. The III-nitride crystal manufacturing method set forth in claim 1 or claim 2, including a step of causing III-nitride crystal that has been grown onto the undersubstrate by a liquid-phase technique to grow further by a vapor-phase technique.

\* \* \* \* \*